United States Patent
Nam et al.

(10) Patent No.: US 10,714,538 B2
(45) Date of Patent: Jul. 14, 2020

(54) ORGANIC LIGHT EMITTING DEVICE AND DISPLAY APPARATUS HAVING THE SAME

(71) Applicant: University-Industry Cooperation Group of Kyung Hee University, Seoul (KR)

(72) Inventors: HyoungSik Nam, Incheon (KR); MinChul Suh, Seoul (KR); SoRa Park, Seoul (KR)

(73) Assignee: UNIVERSITY-INDUSTRY COOPERATION GROUP OF KYUNG HEE UNIVERSITY, Seoul (KR)

( * ) Notice: Subject to any disclaimer, the term of this patent is extended or adjusted under 35 U.S.C. 154(b) by 130 days.

(21) Appl. No.: 16/114,402

(22) Filed: Aug. 28, 2018

(65) Prior Publication Data
US 2019/0206947 A1   Jul. 4, 2019

(30) Foreign Application Priority Data
Dec. 29, 2017   (KR) .................. 10-2017-0183649

(51) Int. Cl.
*H01L 27/32* (2006.01)
*H01L 51/52* (2006.01)
(Continued)

(52) U.S. Cl.
CPC ....... *H01L 27/3209* (2013.01); *G09G 3/3225* (2013.01); *H01L 27/1203* (2013.01);
(Continued)

(58) Field of Classification Search
CPC ............. H01L 51/5203; H01L 51/5056; H01L 51/5044; H01L 51/5278; H01L 51/5072; H01L 51/5028; H01L 51/5096; H01L 27/3209; H01L 27/3246; H01L 27/1203; G09G 3/3225; G09G 3/3233; G09G 3/2074
See application file for complete search history.

(56) References Cited

U.S. PATENT DOCUMENTS 5,703,436 A   12/1997  Forrest et al.
6,967,436 B2  11/2005  Park
(Continued)

FOREIGN PATENT DOCUMENTS

JP   4368638 B2      11/2009
JP   2010055899 A     3/2010
(Continued)

OTHER PUBLICATIONS

The stacked OLED (SOLED): a new type of organic device for achieving high-resolution full-color displays (S. R. Forrest et al., Synthetic Metals 91 (1997) 9-13).
(Continued)

*Primary Examiner* — Jimmy H Nguyen
(74) *Attorney, Agent, or Firm* — Harness, Dickey & Pierce, P.L.C.

(57) ABSTRACT

Provided is an organic light emitting device. The organic light emitting device may include two light emitting layers. One of the two light emitting layers may emit light in a horizontal driving mode, and the other of the two light emitting layers may emit light in a vertical driving mode.

20 Claims, 13 Drawing Sheets

(51) Int. Cl.
G09G 3/3225 (2016.01)
H01L 51/50 (2006.01)
H01L 27/12 (2006.01)
G09G 3/3233 (2016.01)
G09G 3/20 (2006.01)

(52) U.S. Cl.
CPC ...... *H01L 27/3246* (2013.01); *H01L 51/5044* (2013.01); *H01L 51/5056* (2013.01); *H01L 51/5072* (2013.01); *H01L 51/5203* (2013.01); *G09G 3/2074* (2013.01); *G09G 3/3233* (2013.01); *H01L 51/5278* (2013.01)

(56) References Cited

U.S. PATENT DOCUMENTS

| | | | | |
|---|---|---|---|---|
| 8,476,823 | B2* | 7/2013 | Kuma | B82Y 10/00 313/504 |
| 8,710,493 | B2* | 4/2014 | Nishimura | C07D 209/86 257/40 |
| 9,450,017 | B2 | 9/2016 | Han | |
| 2010/0295444 | A1 | 11/2010 | Kuma et al. | |
| 2011/0115693 | A1 | 5/2011 | Kim | |
| 2012/0119197 | A1 | 5/2012 | Nishimura et al. | |
| 2016/0380035 | A1* | 12/2016 | Cho | H01L 27/3246 257/40 |
| 2018/0122870 | A1* | 5/2018 | Park | H01L 51/5044 |

FOREIGN PATENT DOCUMENTS

| | | |
|---|---|---|
| JP | 5273381 B2 | 8/2013 |
| KR | 19950014613 | 12/1995 |
| KR | 10-0432544 B1 | 5/2004 |
| KR | 20110054464 A | 5/2011 |
| KR | 20120029397 A | 3/2012 |
| KR | 20130021350 A | 3/2013 |
| KR | 10-1393745 B1 | 5/2014 |

OTHER PUBLICATIONS

Organic Light Emitting Diode (OLED) and its application to lighting devices (N. Ide, J. Kido, et al., Proc. of SPIE 6333 (2006) 63330M).

Emission Mechanism of Double-Insulating Organic Electroluminescence Device Driven at AC Voltage (S.-B. Lee, T. Tsutsui et al., Japanese Journal of Applied Physics 44 (2005) 6607-6611).

Alternating Current Driven Organic Light Emitting Diodes Using Lithium Fluoride Insulating Layers (S.-Y. Liu, C.-I, Wu et al., Scientific Reports 4 (2014) 7559).

OLEDs with chromaticity tunable between dusk-hue and candle-light (J.-H. Jou et al., Organic Electronics 14 (2013) 47-54).

* cited by examiner

ORGANIC LIGHT EMITTING DEVICE AND DISPLAY APPARATUS HAVING THE SAME

CROSS-REFERENCE TO RELATED APPLICATIONS

This application claims priority to Korean Patent Application No. 10-2017-0186349, filed on Dec. 29, 2017, and all the benefits accruing therefrom under 35 U.S.C. § 119, the content of which in its entirety is herein incorporated by reference.

BACKGROUND

The present disclosure herein relates to an organic light emitting device including two light emitting layers and a display apparatus including the organic light emitting device.

Various display apparatuses used in multimedia equipment such as televisions, mobile phones, table computers, navigation devices, and game consoles are being developed.

There is an organic light emitting display as one of kinds of such display apparatuses. Such an organic light emitting display is a self-light emitting display having a wide viewing angle, excellent contrast, and a high response speed.

The organic light emitting display includes an organic light emitting device. Also, a plurality of light emitting layers are disposed to overlap each other, thereby improving luminous efficiency.

SUMMARY

The present disclosure provides an organic light emitting device in which two light emitting layers individually emit light.

The present invention also provides a display apparatus in which two light emitting layers provided in an organic light emitting device individually emit light.

An embodiment of the inventive concept provides an organic light emitting device including: a first electrode; a first electron transport region disposed below the first electrode; a first light emitting layer disposed below the first electron transport region; a first electron blocking layer disposed below the first light emitting layer; a second light emitting layer including a first area, a second area adjacent to the first area, and a third area adjacent to the second area and disposed below the first electron blocking layer; a second electron transport region disposed below the second light emitting layer to overlap the first area; a second electrode disposed below the second electron transport region; a hole transport region disposed below the second light emitting layer to overlap the third area; a third electrode disposed below the hole transport region; and an insulation member disposed below the second light emitting layer to overlap the second area.

the insulation member insulates the second electron transport region and the second electrode from the hole transport region and the third electrode.

In an embodiment, the organic light emitting device may further include a second electron blocking layer disposed between the second light emitting layer and the hole transport region to overlap the third area.

In an embodiment, the organic light emitting device may further include a charge generating layer disposed between the hole transport region and the third electrode.

In an embodiment, the second electrode and the second electron transport region may overlap only the first area of the first area, the second area, and the third area. In an embodiment, the insulation member may overlap only the second area of the first area, the second area, and the third area. In an embodiment, the third electrode and the hole transport region may overlap only the third area of the first area, the second area, and the third area.

In an embodiment, the first light emitting layer and the second light emitting layer may include the same material.

In an embodiment, the first light emitting layer may include a first material, and the second light emitting layer may include a second material different from the first material.

In an embodiment of the inventive concept, a display apparatus includes a display panel including an organic light emitting device. In an embodiment, the organic light emitting device may include: a first electrode; a first electron transport region disposed below the first electrode; a first light emitting layer disposed below the first electron transport region; a first electron blocking layer disposed below the first light emitting layer; a second light emitting layer including a first area, a second area adjacent to the first area, and a third area adjacent to the second area and disposed below the first electron blocking layer; a second electron transport region disposed below the second light emitting layer to overlap the first area; a second electrode disposed below the second electron transport region; a hole transport region disposed below the second light emitting layer to overlap the third area; a third electrode disposed below the hole transport region; and an insulation member disposed below the second light emitting layer to overlap the second area.

In an embodiment, electrons may be provided in the first electrode and the second electrode, and holes may be provided in the third electrode.

In an embodiment, the first light emitting layer may emit light by at least a portion of the holes provided in the third electrode and at least a portion of the electrons provided in the first electrode.

In an embodiment, the first light emitting layer may emit light by at least a portion of the holes provided in the third electrode and at least a portion of the electrons provided in the second electrode.

In an embodiment, the first light emitting layer and the second light emitting layer may emit light at the same time.

In an embodiment, the first light emitting layer and the second light emitting layer may emit light at timings different from each other.

In an embodiment, the light emitted from the first light emitting layer may have the same color as that of the light emitted from the second light emitting layer.

In an embodiment, the light emitted from the first light emitting layer may have a color different from that of the light emitted from the second light emitting layer.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Hereinafter, exemplary embodiments of the inventive concept will be described with reference to the accompanying drawings.

In the figures, the ratio and dimensions of components are exaggerated for clarity of illustration.

The meaning of 'include' or 'comprise' specifies a property, a fixed number, a step, an operation, an element, a component or a combination thereof, but does not exclude other properties, fixed numbers, steps, operations, elements, components or combinations thereof.

Figure 1:
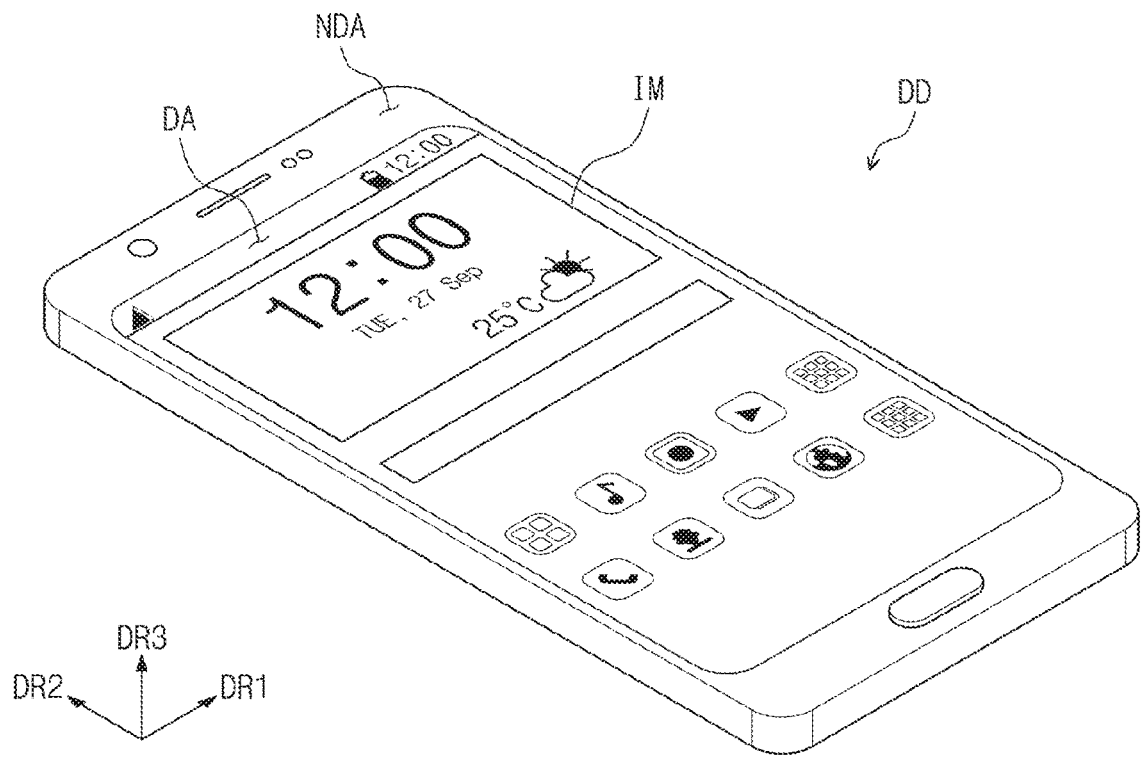
FIG. 1 is a view of a display apparatus according to an embodiment of the inventive concept.
Figure 2:
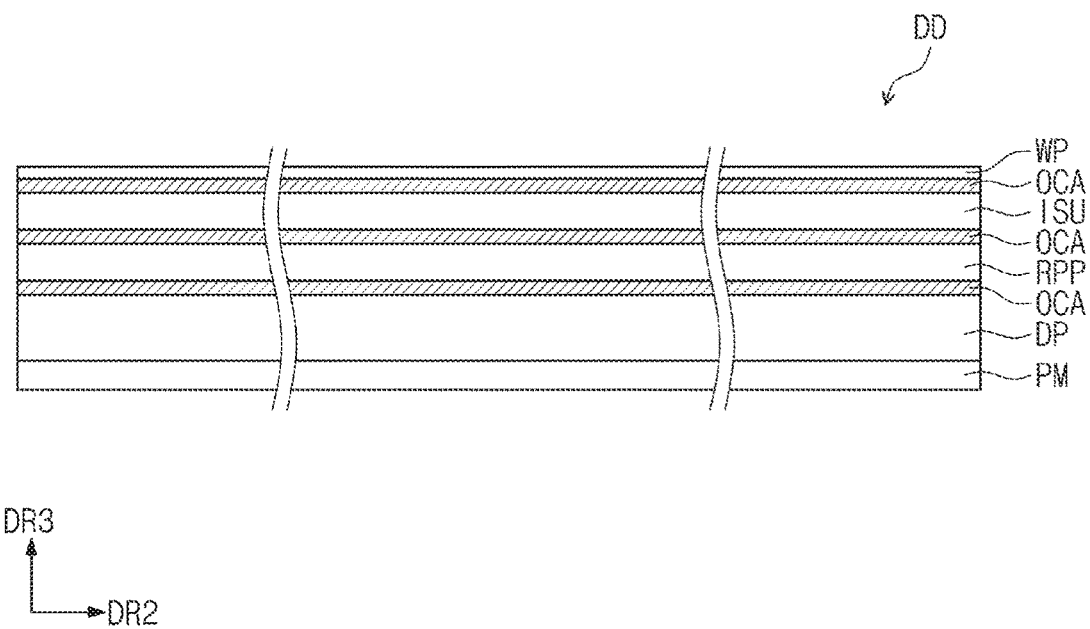
FIG. 2 is a cross-sectional view of the display apparatus of FIG. 1.

FIG. 1 is a perspective view of a display apparatus DD according to an embodiment of the inventive concept. FIG. 2 is a cross-sectional view of the display apparatus of FIG. 1.

In FIG. 1, the display apparatus DD is exemplified as a smart phone. However, the embodiment of the inventive concept is not limited thereto. For example, the display apparatus DD according to an embodiment of the inventive concept may be used for large-sized electronic devices such as televisions and monitors and small and middle-sized electronic devices such as mobile phones, tablet PC, navigation units for vehicles, game consoles, and smart watches.

A display area DA and a non-display area NDA may be defined on the display apparatus DD.

The display area DA on which an image IM is displayed is parallel to a surface defined by a first directional axis DR1 and a second directional axis DR2. A normal direction of the display area DA, i.e., a thickness direction of the display apparatus DD is indicated as a third directional axis DR3. A front surface (or top surface) and a rear surface (or bottom surface) of each of members is distinguished by the third directional axis DR3. However, directions indicated as the first to third directional axes DR1, DR2, and DR3 may be a relative concept and thus changed into different directions. Hereinafter, the first to third directions may be directions indicated by the first to third directional axes DR1, DR2, and DR3 and designated by the same reference numerals, respectively.

The non-display area NDA is an area which is adjacent to the display area DA and on which the image IM is not displayed. A bezel area of the display apparatus DD may be defined by the non-display area NDA. Application icons and watch widgets are illustrated as an example of the image IM in FIG. 1.

As illustrated in FIG. 2, the display apparatus DD may include a display panel DP, an antireflection member RPP, an input sensing unit ISU, a window member WP, and a protection film PM.

The antireflection member RPP may be disposed on the display panel DP, the input sensing unit ISU may be disposed on the antireflection member RPP, and the window member WP may be disposed on the input sensing unit ISU. The protection film PM may be disposed below the display panel DP.

An optical clear adhesive (OCA) may be disposed each of between the display panel DP and the antireflection member RPP, between the antireflection member RPP and the input sensing unit ISU, and between the input sensing unit ISU and the window member WP.

The display panel DP generates an image, and the input sensing unit ISU acquires coordinate information of an external input (for example, a touch event).

The display panel DP according to an embodiment of the inventive concept is an organic light emitting display panel.

The antireflection member RPP reduces reflectance of external light incident from an upper side of the window member WP. The antireflection member RPP according to an embodiment of the inventive concept may include a retarder and a polarizer. The retarder may be a film type or liquid crystal coating type retarder and may include a $\lambda/2$ retarder and/or a $\lambda/4$ retarder. The polarizer may also be a film type or liquid crystal coating type polarizer. The film type may include an elongation-type synthetic resin, and the liquid crystal coating type may include liquid crystals that are arranged in a predetermined arrangement.

The antireflection member RPP according to an embodiment of the inventive concept may include color filters. The color filters may be determined in arrangement in consideration of colors of light emitted from pixels provided in the display panel DP. The antireflection member RPP may further include a black matrix adjacent to the color filters.

The antireflection member RPP according to an embodiment of the inventive concept may include a destructive interference structure. For example, the destructive interference structure may include first reflection layer and a second reflection layer, which are disposed on layers different from each other. First reflected light and second reflected light, which are respectively reflected from the first reflection layer and the second reflection layer, may destructively interfere, and thus, the external light may be reduced in reflectance.

The input sensing unit ISU according to an embodiment of the inventive concept may sense a variation in capacitance due to an external object. This may be referred to as a capacitive input sensing unit (ISU).

Also, the input sensing unit ISU according to another embodiment of the inventive concept may sense a variation in pressure due to an external object. This may be referred to as a pressure sensitive input sensing unit.

The window WM protects the display module DM against an external impact and provides an input surface to a user. The window member WP may include glass or plastic. The window member WP has a transparent property so that light generated in the display panel DP is transmitted.

The protection film PM protects the display panel DP. The protection film PM prevents external moisture from being permeated into the display panel DP and absorbs an external impact.

The protection film PM may include a plastic film as a base layer. The protection film PM may include polyethersulfone (PES), polyacrylate, polyetherimide (PEI), polyethylenenaphthalate (PEN), polyethyleneterephthalate (PET), polyphenylene sulfide (PPS), polyarylate, polyimide (PI), polycarbonate (PC), or poly(arylene ethersulfone).

A material for forming the protection film PM is not limited to plastic resins. For example, the protection film PM may include an organic/inorganic composite material. The protection film PM may include a porous organic layer and an inorganic material that is filled into pores of the organic layer. The protection film PM may further include a functional layer disposed on a plastic film. The functional layer may include a resin layer. The functional layer may be formed in a coating manner.

In an embodiment of the inventive concept, one of the optical clear adhesives (OCA) may be omitted. For example, the optical clear adhesives (OCA) disposed between the display panel DP and the input sensing unit ISU may be omitted. In this case, the input sensing unit ISU may be directly disposed on the display panel DP. Here, the direct disposition may represent that the display panel DP and the input sensing unit ISU are formed through a continuous process.

Figure 3:
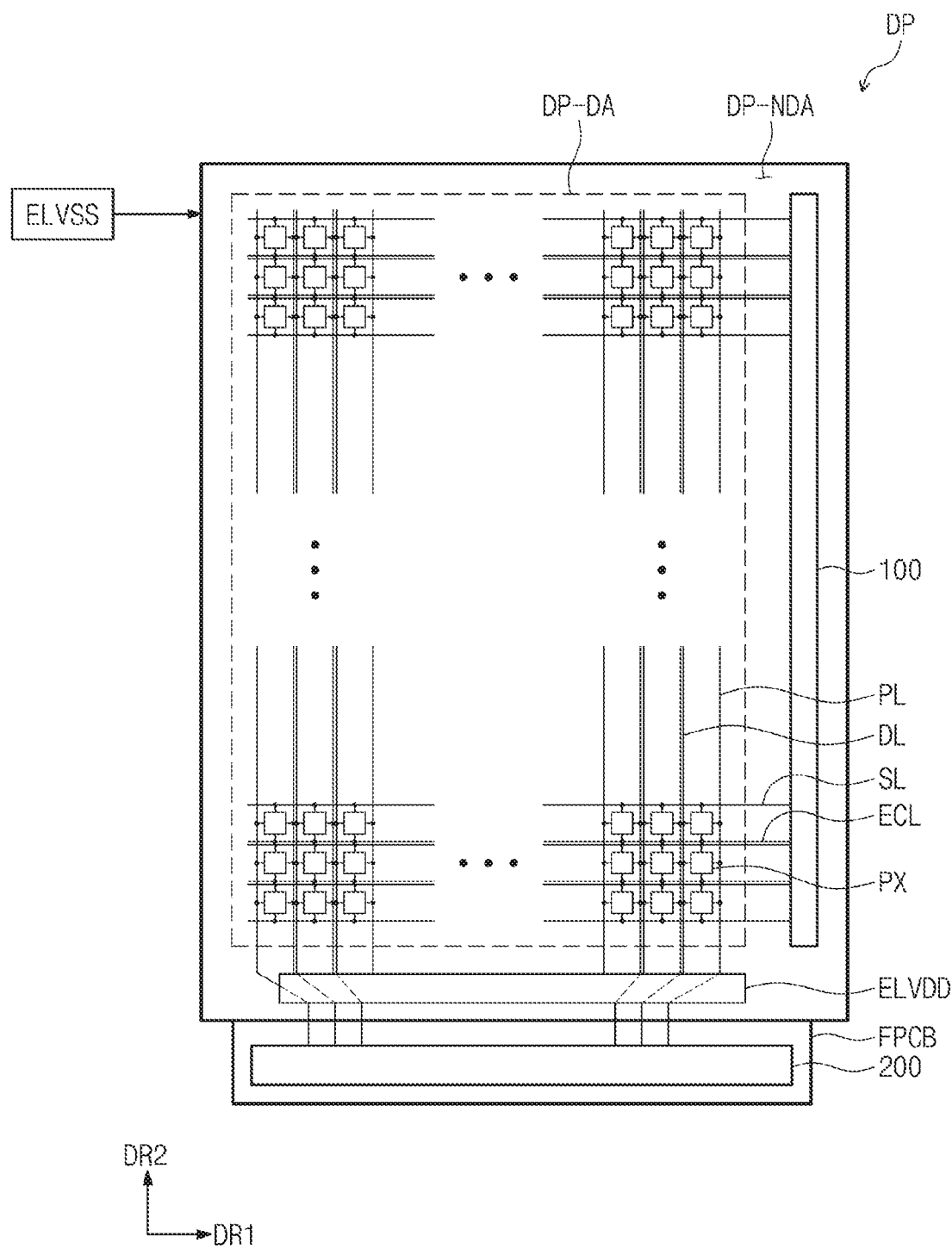
FIG. 3 is a plan view of a display panel according to an embodiment of the inventive concept.

FIG. 3 is a plan view of the display panel DP according to an embodiment of the inventive concept.

The display panel DP includes a display area DP-DA and a non-display area DP-NDA on a plane. In this embodiment, the non-display area DP-NDA may be defined along an edge of the display area DP-DA. The display area DP-DA and the non-display area DP-NDA of the display panel DP may correspond to the display area DD-DA and the non-display area DD-NDA of the display apparatus of FIG. 1, respectively.

The display panel DP may include a scan driver 100, a data driver 200, a plurality of scan lines SL, a plurality of light emitting control lines ECL, a plurality of data lines DL, a plurality of power lines PL, and a plurality of pixels PX (hereinafter, referred to as pixels). The pixels PX are disposed on the display area DP-DA. In an embodiment of the inventive concept, the light emitting control lines ECL may be omitted.

The scan driver 100 may include a scan driving unit and a light emitting control driving unit.

The scan driving unit generates scan signals to sequentially output the generated scan signals to the scan lines SL. The light emitting control driving unit generates light emitting control signals to output the generated light emitting control signals to the light emitting control lines SL.

In another embodiment of the inventive concept, the scan driving unit and the light emitting control driving unit may be provided as one circuit in the scan driver 100 without being divided from each other.

The scan driver 100 may include a plurality of thin film transistors that are manufactured through the same process as the driving circuit of the pixel PX, e.g., a low temperature polycrystalline silicon (LTPS) process or a low temperature polycrystalline oxide (LTPO) process. In one embodiment of the invention, the thin film transistors may be amorphous oxide semiconductor transistors (ex. a-IGZO).

The data driver 200 outputs data signals to the data lines DL. The data signals are analog voltages corresponding to gray level values of the image data.

In an embodiment of the inventive concept, the data driver 200 may be mounted on a printed circuit board FPCB, and the printed circuit board FPCB may be connected to pads disposed on one end of the data lines DL. However, the embodiment of the inventive concept is not limited thereto. For example, the data driving unit 200 may be directly mounted on the display panel DP.

The scan lines SL may extend in a first direction DR1 and be arranged in a second direction DR2 crossing the first direction DR1. In an embodiment of the inventive concept, the first direction DR1 and the second direction DR2 may be perpendicular to each other, but is not limited thereto.

The light emitting control lines ECL may extend in the first direction DR1 and may be arranged in the second direction DR2. That is, each of the light emitting control lines ECL may be arranged in parallel to the corresponding scan lines of the scan lines SL.

The data lines DL extend in the second direction DR2 and are arranged in the first direction DR1 crossing the second direction DR2. The data lines DL may provide data signals to the corresponding pixels PX.

The power lines PL extend in the second direction DR2 and are arranged in the first direction DR1. The power lines PL may provide first power ELVDD to the corresponding pixels PX.

Each of the plurality of pixels PX is connected to the corresponding scan line of the scan lines SL, the corresponding light emitting control line of the light emitting control lines ECL, the corresponding data line of the data lines DL, and the corresponding power line of the power lines PL.

Figure 4:
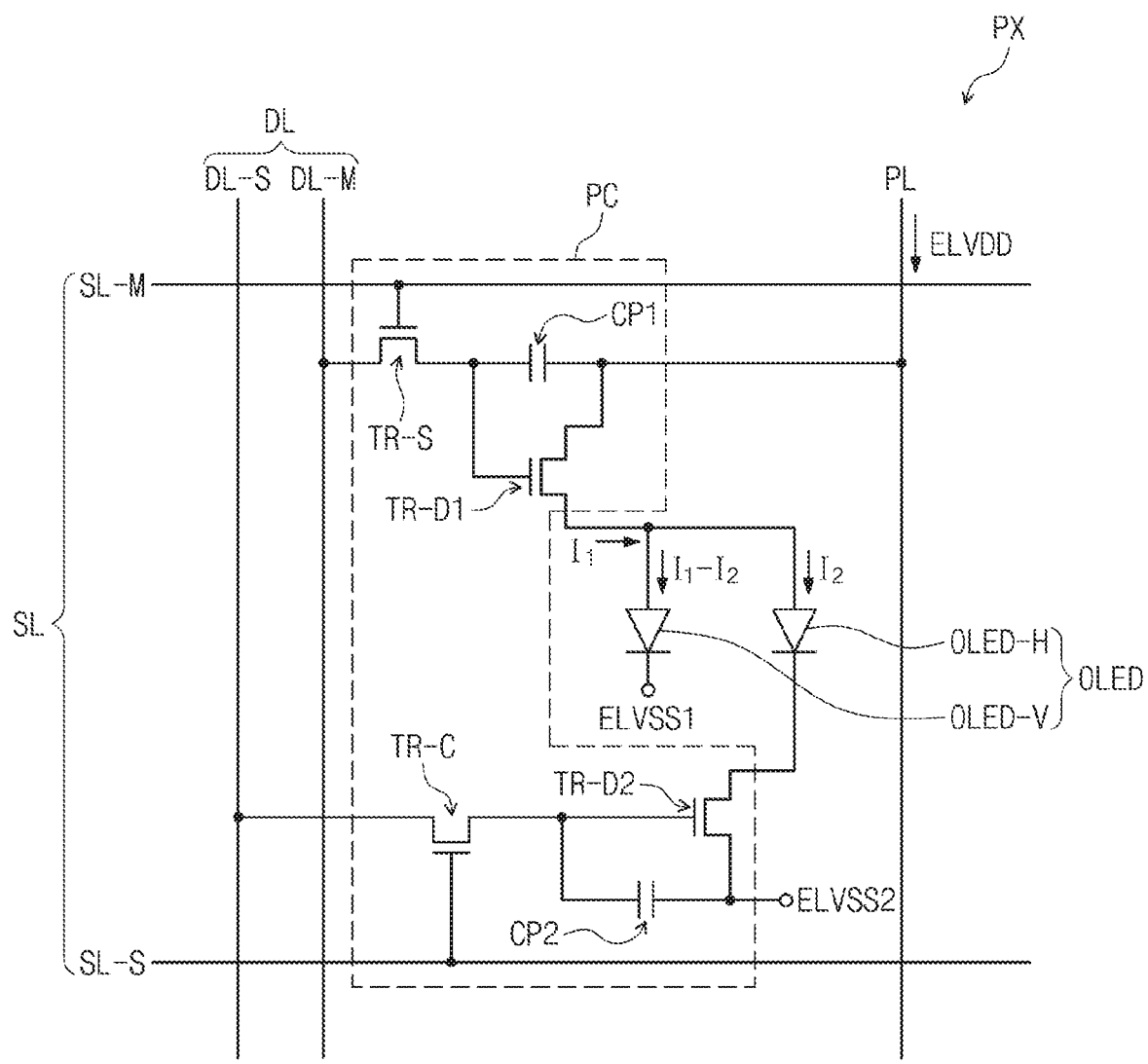
FIG. 4 is an equivalent circuit diagram of a pixel according to an embodiment of the inventive concept.

FIG. 4 is an equivalent circuit diagram of the pixel PX according to an embodiment of the inventive concept.

The pixel PX may include an organic light emitting device OLED and a pixel circuit PC for allowing the organic light emitting device OLED to emit light. The pixel circuit PC may include a switching transistor TR-S, a first driving transistor TR-D1, a first capacitor CP1, a control transistor TR-C, a second driving transistor TR-D2, and a second capacitor CP2.

The scan line SL may include a main scan line SL-M connected to the switching transistor TR-S and a sub scan line SL-S connected to the control transistor TR-C.

The data line DL may include a main data line DL-M connected to the switching transistor TR-S and a sub data line DL-S connected to the control transistor TR-C.

The switching transistor TR-S outputs a data signal applied to the main data line DL-M in response to a scan signal applied to the main scan line SL-M. The first capacitor CP1 charges a voltage corresponding to the data signal received from the switching transistor TR-S. The first driving transistor TR-D1 is connected to the organic light emitting device OLED. The first driving transistor TR-D1 controls driving current flowing through the organic light emitting device OLED to correspond to an amount of charges stored in the first capacitor CP1.

The control transistor TR-C outputs a data signal applied to the sub data line DL-S in response to a scan signal applied to the sub scan line SL-S. The second capacitor CP2 charges a voltage to correspond to the data signal received from the control transistor TR-C.

The organic light emitting device OLED includes a vertical organic light emitting device OLED-V and a horizontal light emitting device OLED-H. A portion of components constituting the vertical organic light emitting device OLED-V may be included in the horizontal organic light emitting device OLED-H.

Second power ELVSS1 may be applied to the vertical organic light emitting device OLED-V. The second power ELVSS1 may have a value different from that of the first power ELVDD. For example, the second power ELVSS1 may have a value less than that of the first power ELVDD.

Third power ELVSS2 may be applied to the second driving transistor TR-D2. The third power ELVSS2 may have a value less than that of the second power ELVSS1.

The horizontal organic light emitting device OLED-V may be connected to the second driving transistor TR-D2. Current flowing through the horizontal organic light emitting device OLED-V may be determined according to an amount of charges stored in the second capacitor CP2.

For example, when current having a first current amount I1 is applied to the organic light emitting device OLED, a current amount I2 (hereinafter, referred to as a second current amount) flowing through the horizontal organic light emitting device OLED-H by the control transistor TR-C may be determined. Thus, current having a current amount I1-I2 that corresponds to a difference between the first current amount I1 and the second current amount I2 may flow through the vertical organic light emitting device OLED-V.

In an embodiment of the prevent invention, as illustrated in FIG. 4, when the data line DL is divided into the main data line DL-M and the sub data line DL-S, the switching transistor TR-S and the control transistor TR-C may be connected to the same scan line without being divided into the main scan line SL-M and the sub scan line SL-S.

In an embodiment of the prevent invention, as illustrated in FIG. 4, when the scan line SL is divided into the main scan line SL-M and the sub scan line SL-S, the switching transistor TR-S and the control transistor TR-C may be connected to the same data line without being divided into the main data line DL-M and the sub data line DL-S.

The equivalent circuit illustrated in FIG. 4 is merely an example and thus is not limited thereto. The pixel PX includes transistors and capacitors.

Figure 5:
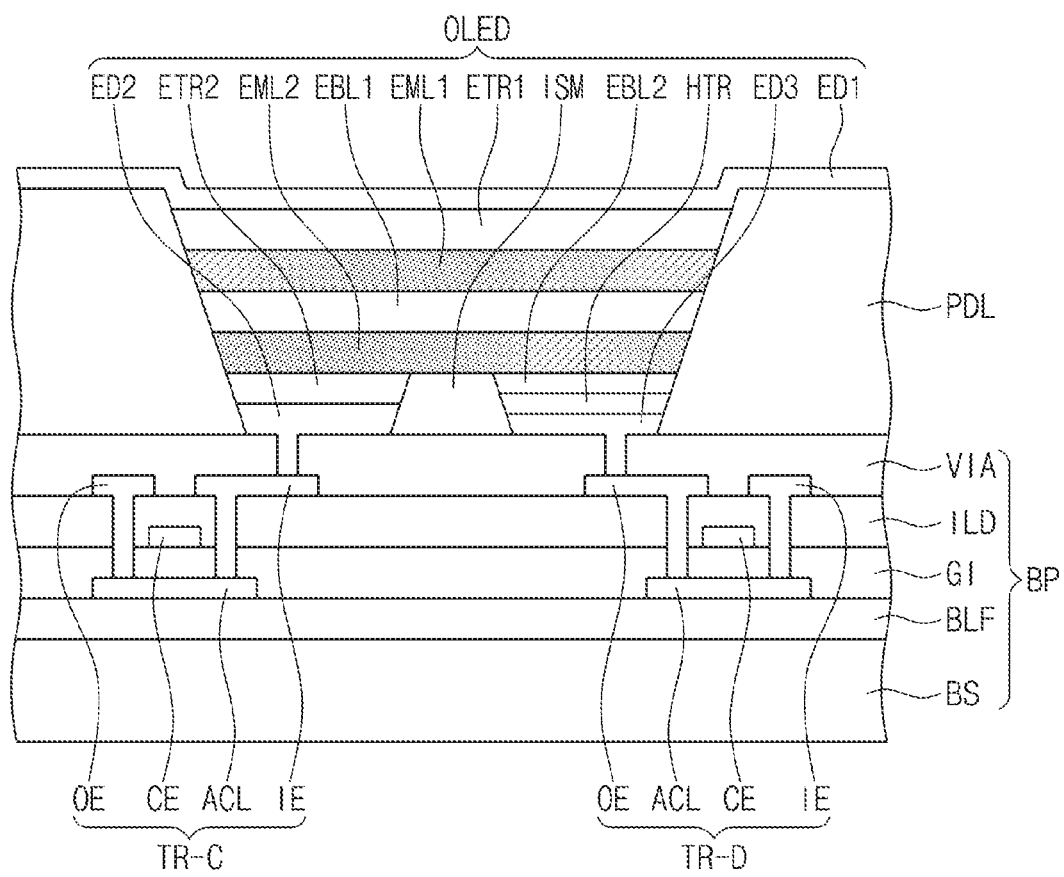
FIG. 5 is a cross-sectional view illustrating a portion of components of the pixel of FIG. 4.

FIG. 5 is a cross-sectional view illustrating a portion of components of the pixel PX of FIG. 4.

FIG. 5 exemplarily illustrates a cross-sectional view of the organic light emitting device OLED, the first driving transistor TR-D1, and the control transistor TR-C.

The display panel DP may include a base substrate BS, a buffer layer BFL, a gate insulation layer GI, an interlayer dielectric ILD, and a passivation layer VIA.

The buffer layer BFL is disposed on one surface of the base substrate BS.

The buffer layer BFL prevents impurities existing on the base substrate BS from being introduced into the pixel PX while the manufacturing process. Particularly, the buffer layer BFL prevents the impurities from be diffused into active parts of the transistors TR-D and TR-C constituting the pixel PX.

The impurities may be introduced from the outside or generated while the base substrate BS is pyrolyzed. The impurities may be gases or sodium discharged from the base substrate BS. Also, the buffer layer BFL may block moisture introduced from the outside into the pixel PX.

The active parts ACL constituting each of the transistors TR-D and TR-C may be disposed on the buffer layer BFL. Each of the active parts ACL may include polysilicon or amorphous silicon. In addition, the active parts ACL may metal oxide semiconductors.

The active parts ACL may include a channel region serving as a passage through which electrons or holes move and first and second ion-doped regions disposed with the channel region therebetween.

The gate insulation layer GI covering the active parts ACL may be disposed on the buffer layer BFL. The gate insulation layer GI includes an organic layer and/or an inorganic layer. The inorganic layer may include silicon nitride or silicon oxide.

The control electrodes CE constituting ach of the transistors TR-D and TR-C may be disposed on the gate insulation layer GI. At least a portion of the scan lines SL and the light emitting control lines ECL may be disposed on the gate insulation layer GI.

The interlayer dielectric ILD covering the control electrodes CE may be disposed on the gate insulation layer GI. The interlayer dielectric ILD includes an organic layer and/or an inorganic layer. The interlayer dielectric ILD may include an inorganic thin film. The inorganic thin films may include silicon nitride and silicon oxide.

At least a portion of the data line DL and the power line PL may be disposed on the interlayer dielectric ILD. Input electrodes IE and output electrodes OE of each of the transistors TR-D and TR-C may be disposed on the interlayer dielectric ILD.

Each of the input electrodes IE and the output electrodes OE may be connected to the corresponding active part ACL through a through-hole passing through the gate insulation layer GI and the interlayer dielectric ILD.

The passivation layer VIA covering the input electrodes IE and the output electrodes OE may be disposed on the interlayer dielectric ILD. The passivation layer VIA includes an organic layer and/or an inorganic layer. The passivation layer VIA may provide a flat surface.

A pixel define layer PDL and the organic light emitting device OLED may be disposed on the passivation layer VIA.

The organic light emitting device OLED may include a first electrode ED1, a second electrode ED2, a third electrode ED3, a first electron transport region ETR1, a second electron transport region ETR2, a first light emitting layer EML1, a second light emitting layer EML2, a first electron blocking layer EBL1, and a second electron blocking layer EBL2, a hole transport region HTR, and an insulation member ISM.

The horizontal organic light emitting device OLED-H (see FIG. 4) may include a third electrode ED3, a hole transport region HTR, a second electron blocking layer EBL2, a second light emitting layer EML2, a second electron transport region ETR2, and a second electrode ED2.

The vertical organic light emitting device OLED-V (see FIG. 4) may include a third electrode ED3, a hole transport region HTR, a second electron blocking layer EBL2, a second light emitting layer EML2, a first electron blocking layer EBL1, a first light emitting layer EML1, a first electron transport region ETR1, and a first electrode ED1.

Figure 6A:
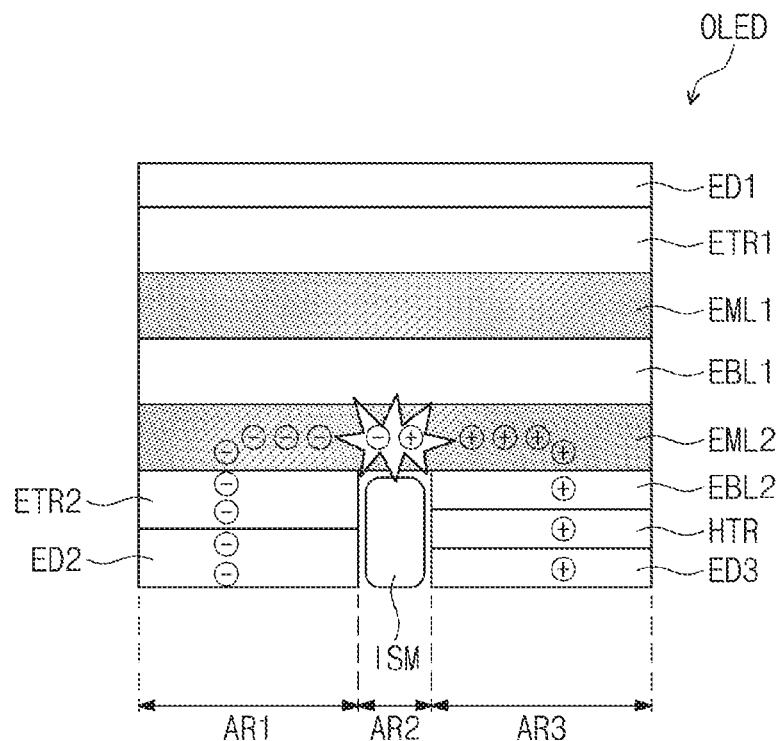
FIGS. 6A and 6B are views for explaining a principle in which one of light emitting layers of an organic light emitting device emits light according to an embodiment of the inventive concept.
Figure 6B:
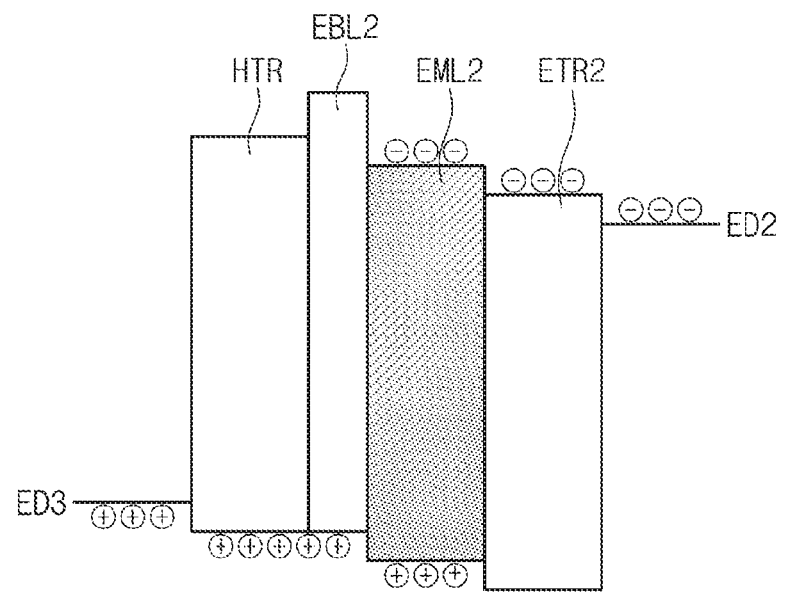
Figure 7A:
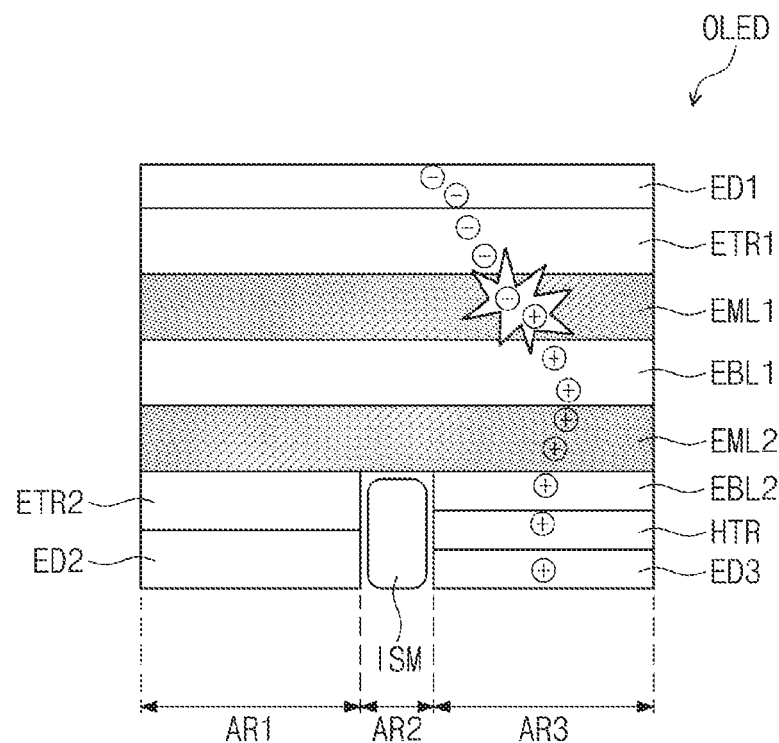
FIGS. 7A and 7B are views for explaining a principle in which the other of the light emitting layers of the organic light emitting device emits light according to an embodiment of the inventive concept.
Figure 7B:
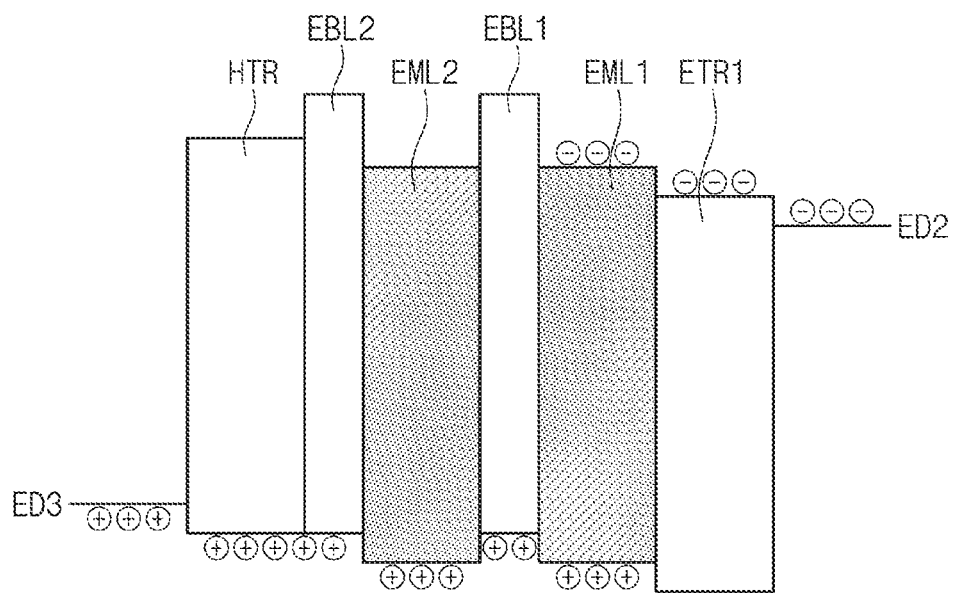

FIGS. 6A and 6B are views for explaining a principle in which one of the light emitting layers of the organic light emitting device OLED emits light according to an embodiment of the inventive concept. FIGS. 7A and 7B are views for explaining a principle in which the other of the light emitting layers of the organic light emitting device OLED emits light according to an embodiment of the inventive concept;

Particularly, FIGS. 6A and 6B illustrate a state in which the horizontal organic light emitting device OLED-H (see FIG. 4) is driven to allow the second light emitting layer EML2 to emit light. FIGS. 7A and 7B illustrate a state in which the vertical organic light emitting device OLED-V (see FIG. 4) is driven to allow the first light emitting layer EML1 to emit light.

When the organic light emitting device OLED is a front emission type light emitting device, the second electrode ED2 and the third electrode ED3 may be reflective electrodes, and the first electrode ED1 may be a transmissive electrode or a transflective electrode. When the organic light emitting device OLED is a rear emission type light emitting device, the second electrode ED2 and the third electrode ED3 may be transmissive electrodes or transflective electrodes, and the first electrode ED1 may be a reflective electrode.

The first electrode ED1 may have conductivity. The first electrode ED1 may be a common electrode or a negative electrode. The first electrode ED1 may be a transmissive electrode, a transflective electrode, or a reflective electrode. When the first electrode ED1 is the transmissive electrode, the first electrode EL1 may include transparent metal oxide, for example, indium tin oxide (ITO), indium zinc oxide (IZO), zinc oxide (ZnO), or indium tin zinc oxide (ITZO).

When the first electrode ED1 is the transflective electrode or the reflective electrode, the first electrode ED1 may include g, Mg, Cu, Al, Pt, Pd, Au, Ni, Nd, Ir, Cr, Li, Ca, LiF/Ca, LiF/Al, Mo, Ti, or a compound or mixture (for example, a mixture of Ag and Mg) thereof. Alternatively, the first electrode ED1 may have a structure of a plurality of layers including a reflective layer or transflective layer and a transparent conductive layer made of indium tin oxide (ITO), indium zinc oxide (IZO), zinc oxide (ZnO), or indium tin zinc oxide (ITZO).

Although not shown, the first electrode ED1 may be connected to an auxiliary electrode. When the first electrode ED1 is connected to the auxiliary electrode, the first electrode ED1 may be reduced in resistance.

The first electron transport region ETR1 may be disposed below the first electrode ED1.

The first electron transport region ETR1 may include at least one of a hole blocking layer, an electron transport layer, or an electron injection layer.

The first electron transport region ETR1 may have a single layer made of a single material, a single layer made of materials different from each other, or a multi-layered structure including a plurality of layers made of materials different from each other.

For example, the first electron transport region ETR1 may have a structure of the electron transport layer/electron injection layer, which are sequentially laminated, or a structure of the hole blocking layer/the electron transport layer/electron injection layer, which are sequentially laminated, but is not limited thereto. The first electrode transport region ETR1 may have a thickness of, for example, about 1,000 Å to about 1,500 Å.

The first electron transport region ETR1 may be formed by using various methods such as a vacuum deposition method, a spin coating method, a casting method, a Langmuir-Blodgett (LB) method, an inject printing method, a laser printing method, and a laser induced thermal imaging (LITI) method.

When the first electron transport region ETR1 includes the electron transport layer, the first electron transport region ETR1 may include Tris(8-hydroxyquinolinato)aluminum (Alq3), 1,3,5-tri[(3-pyridyl)-phen-3-yl]benzene, 2,4,6-tris (3'-(pyridin-3-yl)biphenyl-3-yl)-1,3,5-triazine, bis[2-(diphenylphosphino)phenyl]ether oxide (DPEPO), 2-(4-(N-phenylbenzoimidazolyl-1-ylphenyl)-9,10-dinaphthylanthracene, 1,3,5-Tri(1-phenyl-1H-benzo[d] imidazol-2-yl)phenyl (TPBi), 2,9-Dimethyl-4,7-diphenyl-1, 10-phenanthroline (BCP), 4,7-Diphenyl-1,10-phenanthroline (Bphen), 3-(4-Biphenylyl)-4-phenyl-5-tert-butylphenyl-1,2,4-triazole (TAZ), 4-(Naphthalen-1-yl)-3,5-diphenyl-4H-1,2,4-triazole (NTAZ), 2-(4-Biphenylyl)-5-(4-tert-butylphenyl)-1,3,4-oxadiazole (tBu-PBD), Bis(2-methyl-8-quinolinolato-N1,O8)-(1,1'-Biphenyl-4-olato) aluminum (BAlq), berylliumbis(benzoquinolin-10-olate (Bebq2), 9,10-di(naphthalene-2-yl)anthracene (ADN), and a mixture thereof, but is not limited thereto. The electron transport layer may have a thickness of about 100 Å to about 1,000 Å, preferably, about 150 Å to about 500 Å. When the electron transport layer has a thickness within the above-described range, satisfactory electron transport characteristics may be achieved without substantially increasing in driving voltage.

When the first electron transport region ETR1 includes the electron injection layer, the first electron transport region ETR1 may include lanthanum metals such as LiF, Lithium quinolate (LiQ), $Li_2O$, BaO, NaCl, CsF, and Yb or metal halides such as RbCl and RbI, but is not limited thereto. The electron injection layer may also be made of a mixture of the material for the electron transport material and an organo metal salt. The organo metal salt may be a material having an energy band gap of about 4 eV or more. For example, the organo metal salt may include metal acetate, metal benzoate, metal acetoacetate, metal acetylacetonate, or metal stearate. The electron injection layer may have a thickness of about 1 Å to about 100 Å, preferably, about 3 Å to about 90 Å. When each of the electron injection layers has a thickness within the above-described range, satisfactory electron injection characteristics may be achieved without substantially increasing in driving voltage.

As described above, the first electron transport region ETR1 may include the hole blocking layer. For example, the hole blocking layer may include 2,9-dimethyl-4,7-diphenyl-1,10-phenanthroline (BCP), 4,7-diphenyl-1,10-phenanthroline (Bphen), or bis[2-(diphenylphosphino)phenyl]ether oxide (DPEPO), but is not limited thereto.

The first light emitting layer EML1 may be disposed below first electron transport region ETR1.

The first light emitting layer EML1 may be formed by using various methods such as a vacuum deposition method, a spin coating method, a casting method, a Langmuir-Blodgett (LB) method, an inject printing method, a laser printing method, and a laser induced thermal imaging (LITI) method.

The first light emitting layer EML1 is not specifically limited as long as a material for forming the light emitting layer EML is usually used. For example, the light emitting layer EML may be made of materials that emit red, green, and blue colors. Alternatively, the light emitting layer may include a phosphor material and a fluorescent material. Also, the first light emitting layer EML1 may include a host or dopant.

The host is not specifically limited if the host material is capable of being generally used. For example, the host may include tris(8-hydroxyquinolino)aluminum (Alq3), 4,4'-bis (N-carbazolyl)-1,1'-biphenyl (CBP), poly(n-vinylcabazole) (PVK), 9,10-di(naphthalene-2-yl)anthracene (ADN), 4,4', 4"-Tris(carbazol-9-yl)-triphenylamine (TCTA), 1,3,5-tris (N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), and 2-Methyl-9,10-bis(naphthalen-2-yl)anthracene (MADN).

For example, the highest occupied molecular orbital (HOMO) energy level of the host may be 5.5 eV to 5.9 eV. For example, the lowest unoccupied molecular orbital (LUMO) energy level of the host may be 2.5 eV to 2.8 eV. However, the highest occupied molecular orbital (HOMO) energy level of the host and the lowest unoccupied molecular orbital (LUMO) energy level of the host are not limited to the above-described ranges.

1 When the first light emitting layer EML1 emits light, the first light emitting layer EML1 may include, for example, a phosphor material including tris(dibenzoylmethanato)

phenanthoroline europium (PBD:Eu(DBM)3(Phen)) and perylene. When the first light emitting layer EML1 emits red light, the dopant material contained in the first light emitting layer EML1 may be, for example, selected from a metal complex or an organometallic complex such as bis(1-phenylisoquinoline)acetylacetonate iridium (PIQIr(acac)), bis (1-phenylquinoline)acetylacetonate iridium (PQIr(acac)), tris(1-phenylquinoline)iridium (PQIr), and octaethylporphyrin platinum (PtOEP).

When the first light emitting layer EML1 emits green light, the first light emitting layer EML1 may include, for example, a fluorescent material including tris(8-hydroxyquinolino)aluminum (Alq3). When the first light emitting layer EML1 emits the green light, the dopant contained in the first light emitting layer EML1 may be selected from, for example, a metal complex or organometallic complex such as fac-tris(2-phenylpyridine)iridium (Ir(ppy)3).

When the first light emitting layer EML1 emits blue light, the first light emitting layer EML1 may include, for example, a fluorescent material including at least one selected from the group consisting spiro-DPVBi, spiro-6P, distyryl-benzene (DSB), distyryl-arylene (DSA), polyfluorene (PFO)-based polymer, or poly(p-phenylene vinylene (PPV)-based polymer. When the first light emitting layer EML1 emits the blue light, the dopant contained in the first light emitting layer EML1 may be selected from, for example, a metal complex or organometallic complex such as (4,6-F2ppy)2Irpic.

The first electron blocking layer EBL1 may be disposed below the first light emitting layer EML1.

The first electron blocking layer EBL1 may include general materials that are known in the art. The first electron blocking layer EBL1 may include, for example, a carbazole-based derivative such as N-phenylcarbazole and polyvinylcarbazole, a fluorine-based derivative, a triphenylamine-based derivative such as N,N'-bis(3-methylphenyl)-N,N'-diphenyl-[1,1-biphenyl]-4,4'-diamine (TPD) and 4,4',4"-tris (N-carbazolyl)triphenylamine (TCTA), N,N'-di (naphthalene-1-yl)-N,N'-diplienyl-benzidine (NPD), 4,4'-Cyclohexylidene bis[N,N'-(4-methylphenyl)benzenamine] (TAPC), 4,4'-Bis[N,N'-(3-tolyl)aminol]-3,3'-dimethylbiphenyl (HMTPD), or mCP, but is not limited or thereto. Also, the first electron blocking layer EBL1 may include a nitrogen-containing compound according to an embodiment of the inventive concept.

The second light emitting layer EML2 may be disposed below the first electron blocking layer EBL1. The second light emitting layer EML2 may include a first area AR1, a second area AR2 adjacent to the first area AR1, and a third area AR3 adjacent to the second area AR2. The first area AR1 and the third area AR3 may be divided by the second area AR2.

In an embodiment of the inventive concept, the second light emitting layer EML2 may include a light emitting material having superconducting properties. For example, the second light emitting layer EML2 may include perovskite. Thus, a light emitting ability of the second light emitting layer EML2 may be prevented from being deteriorated by the insulation member ISM.

In addition, description of the second light emitting layer EML2 is substantially the same as that of the first light emitting layer EML1 and thus will be omitted.

The second electron transport region ETR2 may be disposed below the first area AR1 of the second light emitting layer EML2. Particularly, the second electron transport region ETR2 may overlap the first area AR1 but may not overlap the second area AR2 and the third area AR3.

In addition, description of the second electron transport region ETR2 is substantially the same as that of the first electron transport region ETR1 and thus will be omitted.

The second electrode ED2 may be disposed below the second electron transport region ETR2. Particularly, the second electrode ED2 may overlap the first area AR1 but may not overlap the second area AR2 and the third area AR3.

In addition, description of the second electrode ED2 is substantially the same as that of the first electrode ED1 and thus will be omitted.

The insulation member ISM may be disposed below the second area AR2 of the second light emitting layer EML2. Particularly, the insulation member ISM may overlap the second area AR2 but may not overlap the first area AR1 and the third area AR3.

In an embodiment of the inventive concept, the insulation member ISM may be formed in the same process as that for forming the pixel define layer PDL (see FIG. 5). Thus, the insulation member ISM may include the same material as that of the pixel define layer PDL. However, the embodiment of the inventive concept is not limited thereto, the insulation member ISM may be formed through a separate process different from that for forming the pixel define layer PDL (see FIG. 5).

The insulation member ISM serves to separate the second electrode ED2 and the second electron transport region ETR2 from the third electrode ED3, the hole transport region HTR, and the electron blocking layer EBL2. Thus, the second electrode ED2 and the second electron transport region ETR2 may be insulated from the third electrode ED3, the hole transport region HTR, and the second electron blocking layer EBL2 by the insulation member ISM.

The second electron blocking layer EBL2 may be disposed below the third area AR3 of the second light emitting layer EML2. Particularly, the second electron blocking layer EBL2 may overlap the third area AR3 but may not overlap the first area AR1 and the second area AR2.

In addition, description of the second electron blocking layer EBL2 is substantially the same as that of the first electron blocking layer EBL1 and thus will be omitted.

The hole transport region HTR may be disposed below the second electron blocking layer EBL2. Particularly, the hole transport region HTR may overlap the third area AR3 but may not overlap the first area AR1 and the second area AR2.

The hole transport region HTR may include at least one of a hole injection layer, a hole transport layer, a hole buffer layer, or an electrode blocking layer.

The hole transport region HTR may have a single layer structure made of a single material, a single layer structure made of materials different from each other, or a multi-layered structure including a plurality of layers made of materials different from each other.

For example, the hole transport region HTR may have a structure of the hole injection layer/the hole transport layer, the hole injection layer/the hole transport layer/the hole buffer layer, the hole injection layer/the hole buffer layer, the hole transport layer/the hole buffer layer, or the hole injection layer/the hole transport layer/the electron blocking layer, which are sequentially laminated, but is not limited thereto.

The hole transport region HTR may be formed by using various methods such as a, vacuum deposition method, a spin coating method, a casting method, a Langmuir-Blodgett (LB) method, an inject printing method, a laser printing method, and a laser induced thermal imaging (LITI) method.

The hole injection material may include, for example, a phthalocyanine compound such as copper phthalocyanine; N,N'-diphenyl-N,N'-bis-[4-(phenyl-m-tolyl-amino)-phenyl]-biphenyl-4,4'-diamine (DNTPD), 4,4',4"-tris(3-methylphenylphenylamino) triphenylamine (m-MTDATA), 4,4'4"-Tris(N,N-diphenylamino)triphenylamine (TDATA), 4,4',4"-tris{N,-(2-naphthyl)-N-phenylamino}-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), and polyaniline/poly(4-styrenesulfonate) (PANI/PSS), N,N'-di(naphthalene-1-yl)-N,N'-diplienyl-benzidine (NPD), polyether ketones containing triphenylamine (TPAPEK), 4-Isopropyl-4'-methyldiphenyliodonium Tetrakis(pentafluorophenyl)borate], and dipyrazino[2,3-f: 2',3'-h] quinoxaline-2,3,6,7,10,11-hexacarbonitrile (HAT-CN).

The hole transport layer may include, for example, a carbazole-based derivative such as N-phenylcarbazole and polyvinylcarbazole, a fluorine-based derivative, a triphenylamine-based derivative such as N,N'-bis(3-methylphenyl)-N,N'-diphenyl-[1,1-biphenyl]-4,4'-diamine (TPd) and 4,4',4"-tris(N-carbazolyl)triphenylamine (TCTA), N,N'-di(naphthalene-1-yl)-N,N'-di(naphthalene-1-yl)diplienyl-benzidine (NPB), 4,4'-Cyclohexylidene bis[N,N-bis(4-methylphenyl)benzenamine] (TAPC), and 4,4'-Bis[N,N'-(3-tolyl)amino]-3,3'-dimethylbiphenyl (HMTPD), but is not limited or thereto.

The electron blocking layer may include general materials that are known in the art.

The hole transport region HTR may have a thickness of about 100 Å to about 10,000 Å, preferably, about 100 Å to about 5,000 Å. The electron injection layer may have a thickness of about 30 Å to about 1,000 Å, and the hole transport layer may have a thickness of about 30 Å to about 1,000 Å. For example, the electron blocking layer may have a thickness of about 10 Å to about 1,000 Å. When each of the hole transport region HTR, the hole injection layer, the hole transport layer, and the electron blocking layer has a thickness within the above-described range, satisfactory hole transport characteristics may be achieved without substantially increasing in driving voltage.

The hole transport region HTR may further include a charge generating material in addition to the above-described materials to improve conductivity. The charge generating material may be uniformly or non-uniformly dispersed in the hole transport region HTR. For example, the charge generating material may be a p-dopant. The p-dopant may be one of a quinone derivative, a metal oxide derivative, a cyano-containing compound, but is not limited thereto. For example, according to a non-limiting example of the p-dopant, the p-dopant may include a quinine derivative such as tetracyanoquinodimethane (TCNQ) and 2,3,5,6-tetrafluorotetracyanoquinodimethane (F4-TCNQ) and metal oxide such as tungsten oxide and molybdenum oxide, but is not limited thereto.

The hole buffer layer may compensate a resonant distance according to a wavelength of light emitted from the light emitting layers EML1 and EML2. The electron blocking layer is a layer that servers to prevent electrons from being injected from the electron transport regions ETR1 and ETR2 to the hole transport region HTR.

The third electrode ED3 may be disposed below the hole transport region HTR. Particularly, the third electrode ED3 may overlap the third area AR3 but may not overlap the first area AR1 and the second area AR2.

In addition, description of the second electrode ED2 is substantially the same as that of the first electrode ED1 and thus will be omitted.

Referring to FIGS. 6A and 6B, in the organic light emitting device OLED, as a voltage is applied to each of the second electrode ED2 and the third electrode ED3, the holes injected from the third electrode ED3 move to the second light emitting layer EML2 via the hole transport region HTR and the second electron blocking layer EBL2, and the electrons injected from the second electrode ED2 move to the second light emitting layer EML2 via the second electron transport region ETR2. The electron and the hole may be recombined with each other in the second light emitting layer to generate exciton. Here, the exciton may drop from an excited state into the ground state to emit light. As described above, a phenomenon in which the horizontal organic light emitting device OLED-H (see FIG. 4) is driven to allow the second light emitting layer EML2 to emit light may be defined as a horizontal driving mode.

Referring to FIGS. 7A and 7B, in the organic light emitting device OLED, as a voltage is applied to each of the first electrode ED1 and the second electrode ED2, the holes injected from the third electrode ED3 move to the first light emitting layer EML1 via the hole transport region HTR, the second electron blocking layer EBL2, the second electron blocking layer EBL2, and the second light emitting layer EML2, and the electrons injected from the first electrode ED1 move to the first light emitting layer EML1 via the first electron transport region ETR1. The electron and the hole may be combined with each other in the first light emitting layer EML1 to generate exciton. Here, the exciton may drop from an excited state into the ground state to emit light. As described above, a phenomenon in which the vertical organic light emitting device OLED-V (see FIG. 4) is driven to allow the first light emitting layer EML1 to emit light may be defined as a vertical driving mode.

In an embodiment of the inventive concept, the vertical driving mode and the horizontal driving mode may be performed at the same time to allow the first light emitting layer EML1 and the second light emitting layer EML2 to emit light at the same time.

In an embodiment of the inventive concept, the vertical driving mode and the horizontal driving mode may be performed at different timings to allow the first light emitting layer EML1 and the second light emitting layer EML2 to emit light at different timings.

In an embodiment of the inventive concept, light emitted from the first light emitting layer EML1 may have the same color as that of light emitted from the second light emitting layer EML2. This is done because a material forming the first light emitting layer EML1 is substantially the same as that for forming the second light emitting layer EML2.

In an embodiment of the inventive concept, light emitted from the first light emitting layer EML1 may have a color different from that of light emitted from the second light emitting layer EML2. This is done because a material forming the first light emitting layer EML1 is different from that for forming the second light emitting layer EML2.

Figure 8:
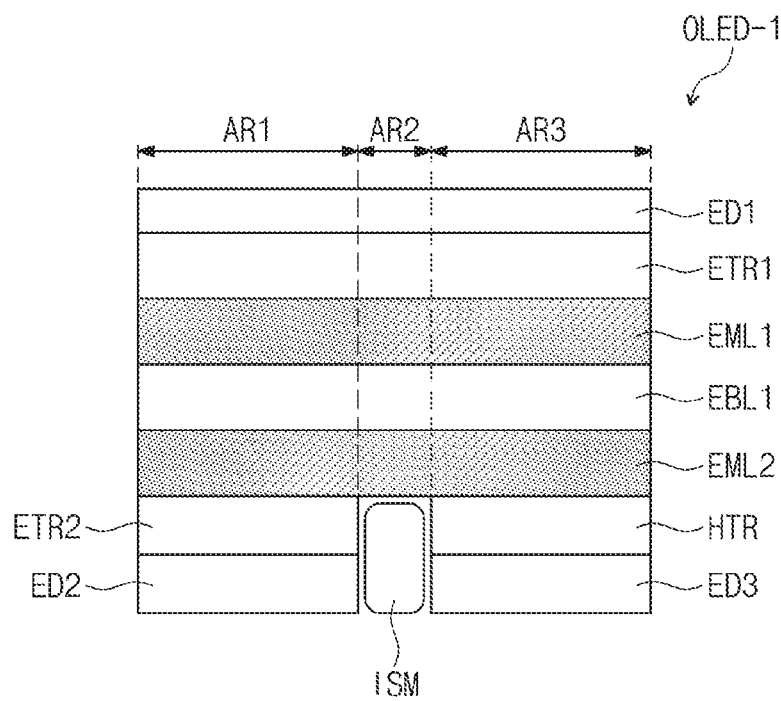
FIGS. 8 and 9 are views illustrating a structure of the organic light emitting device according to an embodiment of the inventive concept.
Figure 9:
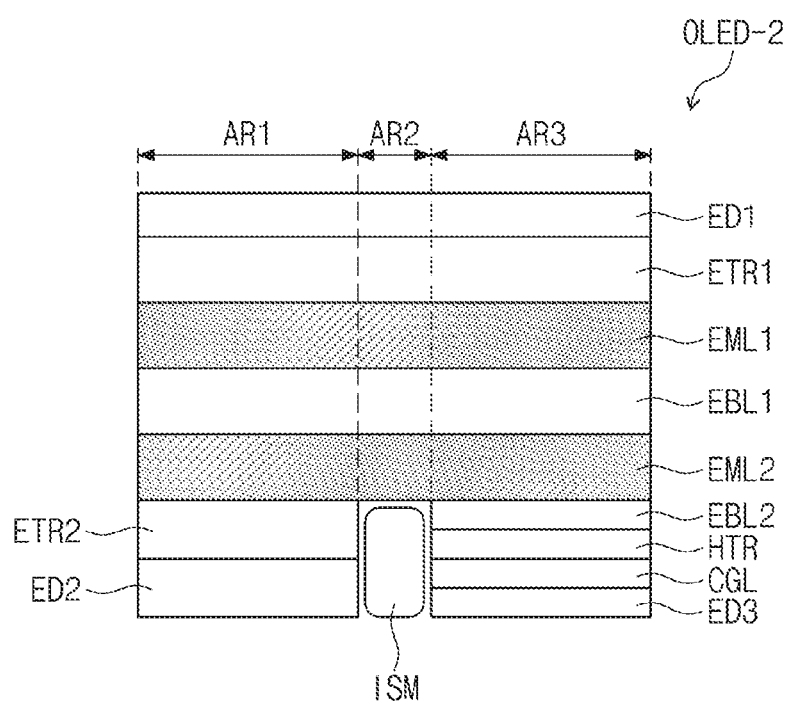

FIGS. 8 and 9 are views illustrating a structure of an organic light emitting device OLED-1 according to an embodiment of the inventive concept.

The organic light emitting device OLED-1 of FIG. 8 has a structure in which the second electron blocking layer EBL2 is removed from the organic light emitting device OLED of FIGS. 6A to 7B.

When the hole transport region HTR of the organic light emitting device OLED-1 has sufficient barriers that are enough to block the electrons, the second electron blocking layer EBL2 may be omitted.

Descriptions with respect to other components are substantially the same as those of the components of FIGS. 6A to 7B and thus will be omitted.

An organic light emitting device OLED-2 of FIG. 9 may further include a charge generating layer CGL when compared with the organic light emitting device OLED of FIGS. 6A to 7B.

The charge generating layer CGL may include a charge generating material. Descriptions with respect to the charge generating material of the charge generating layer CGL are substantially the same as those with respect to the charge generating material of the hole transport region HTR and thus will be omitted.

FIGS. 10A, 10B, 10C, 10D, 10E, and 10F are views illustrating a process of manufacturing the organic light emitting device OLED-1 of FIG. 8.

The pixel define layer PDL and the insulation member ISM are disposed on a back plane BP. The back plane BP includes a base substrate BS, a buffer layer BLF, a gate insulation layer GI, and a passivation layer VIA.

Figure 10A:
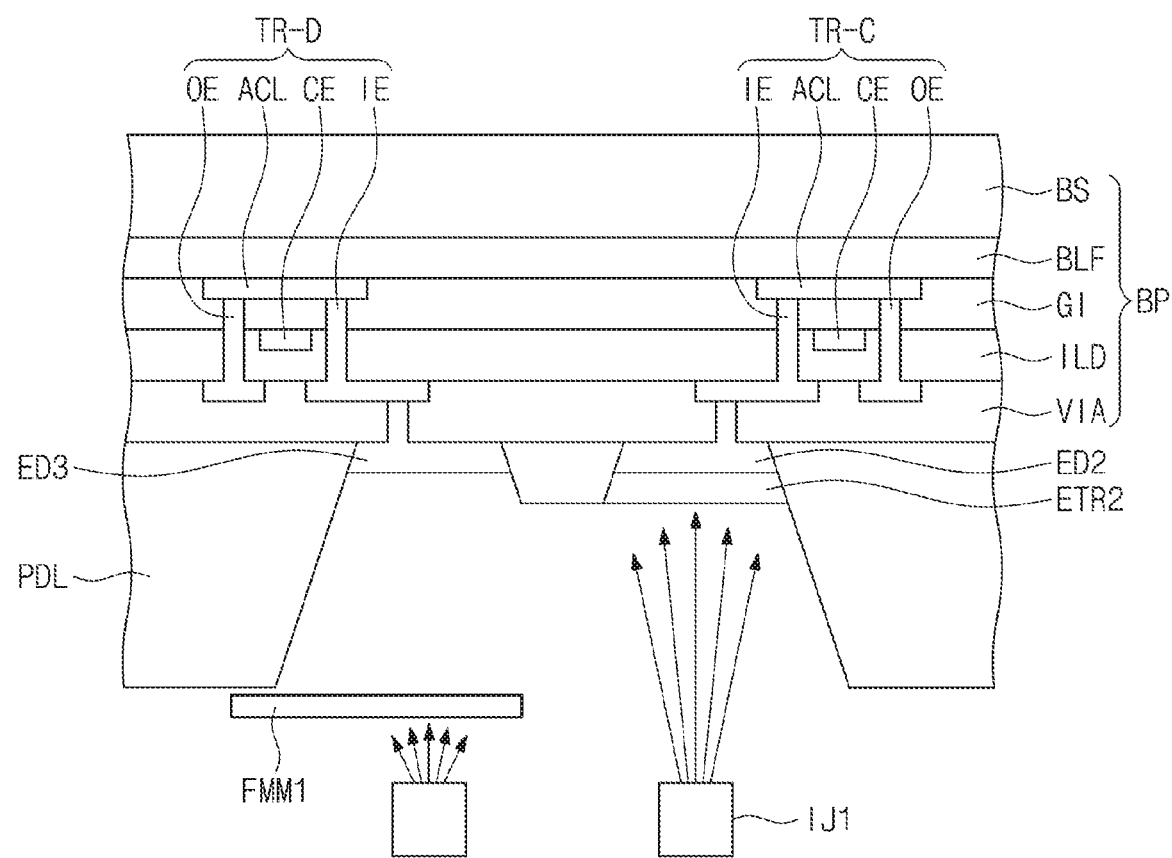
FIGS. 10A, 10B, 10C, 10D, 10E, and 10F are views illustrating a process of manufacturing the organic light emitting device of FIG. 8.
Figure 10B:
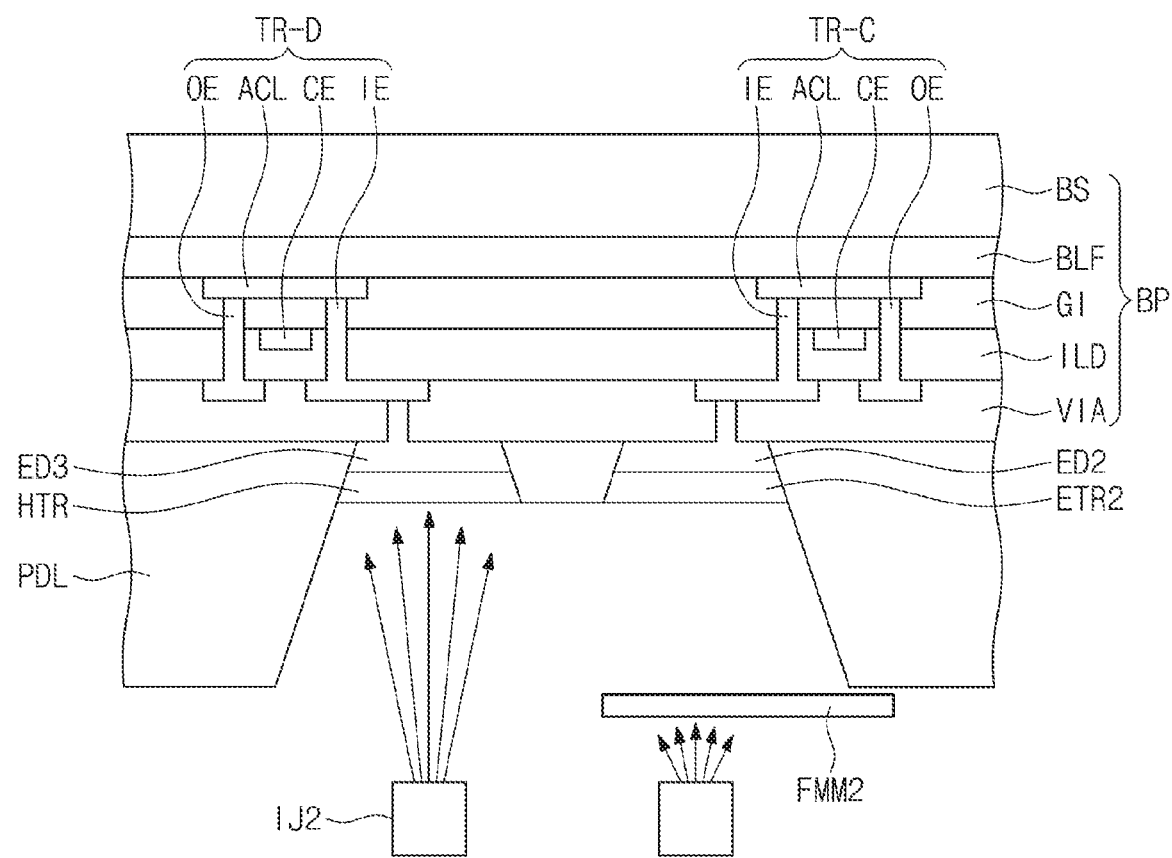

Referring to FIG. 10A, a first injector IJ1 discharges a material for forming the second electron transport region ETR2. The material discharged from the first injector IJ1 may be disposed on the second electrode ED2 and may not be disposed on the third electrode ED3 by a first mask FMM1.

Referring to FIG. 10A, a second injector IJ2 may discharge a material for forming the hole transport region HTR. The material discharged from the second injector IJ2 may be disposed on the third electrode ED3 and may not be disposed on the second electrode ED2 by a second mask FMM2.

Figure 10C:
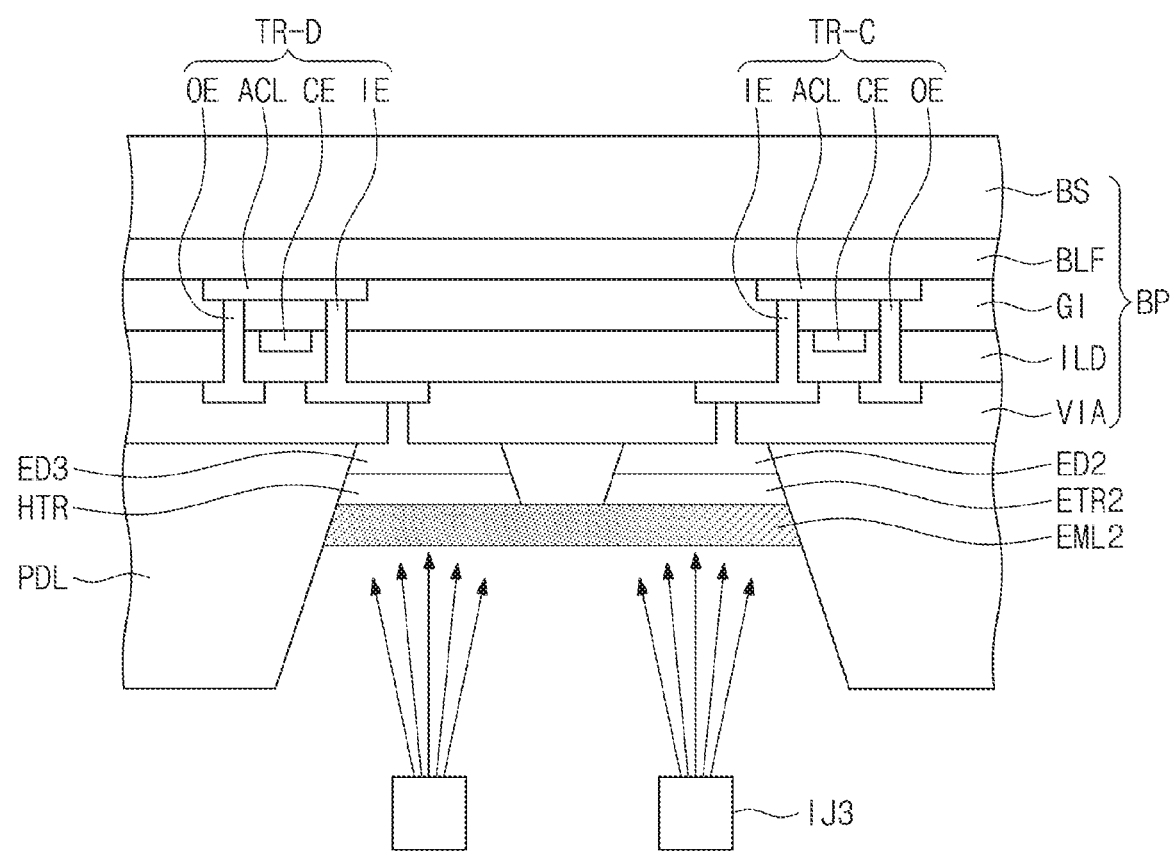

Referring to FIG. 10C, a third injector IJ3 may discharge a material for forming the second light emitting layer EML2. The material discharged from the third injector IJ3 may be disposed on the second electrode ED2, the third electrode ED3, and the insulation member ISM.

Figure 10D:
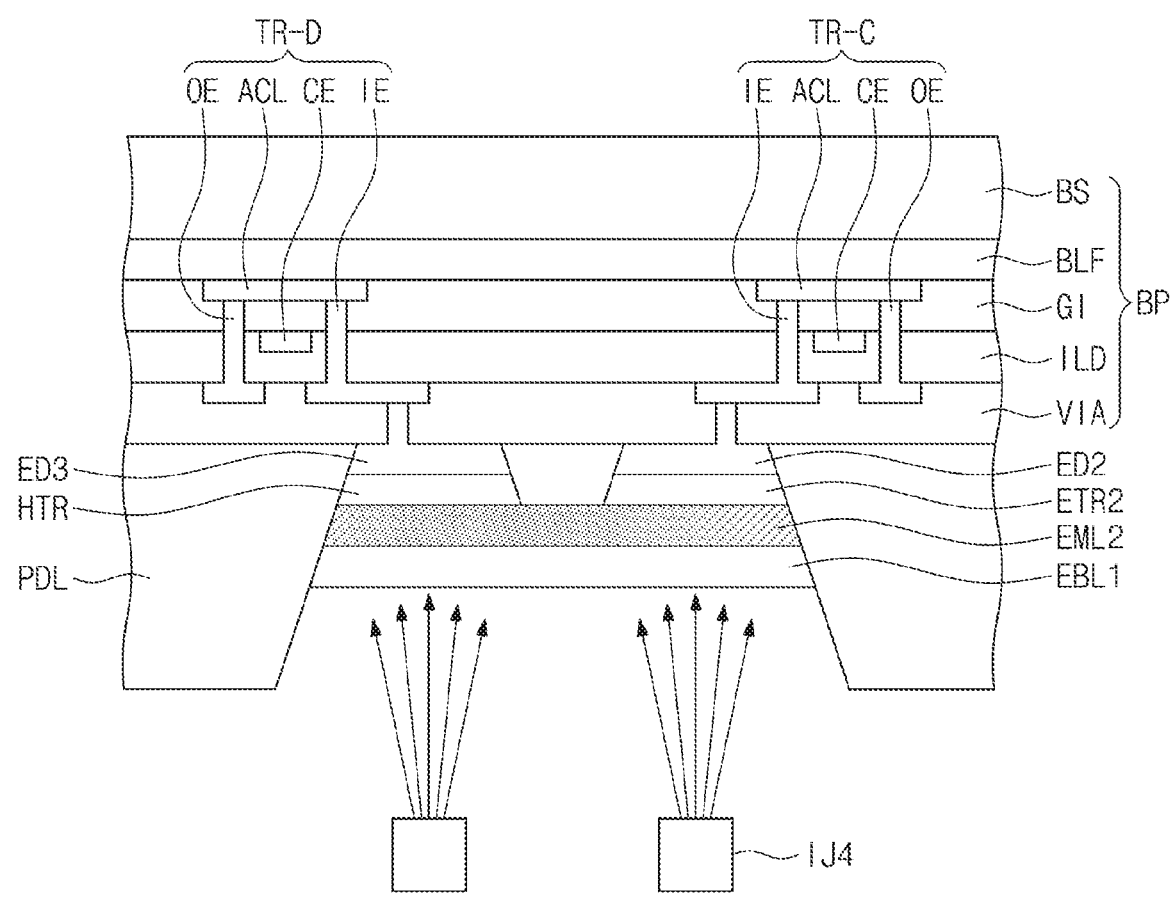

Referring to FIG. 10D, a fourth injector IJ4 may discharge a material for forming the first electron blocking layer EBL1. The material discharged from the fourth injector IJ4 may be disposed on the second light emitting layer EML2.

Figure 10E:
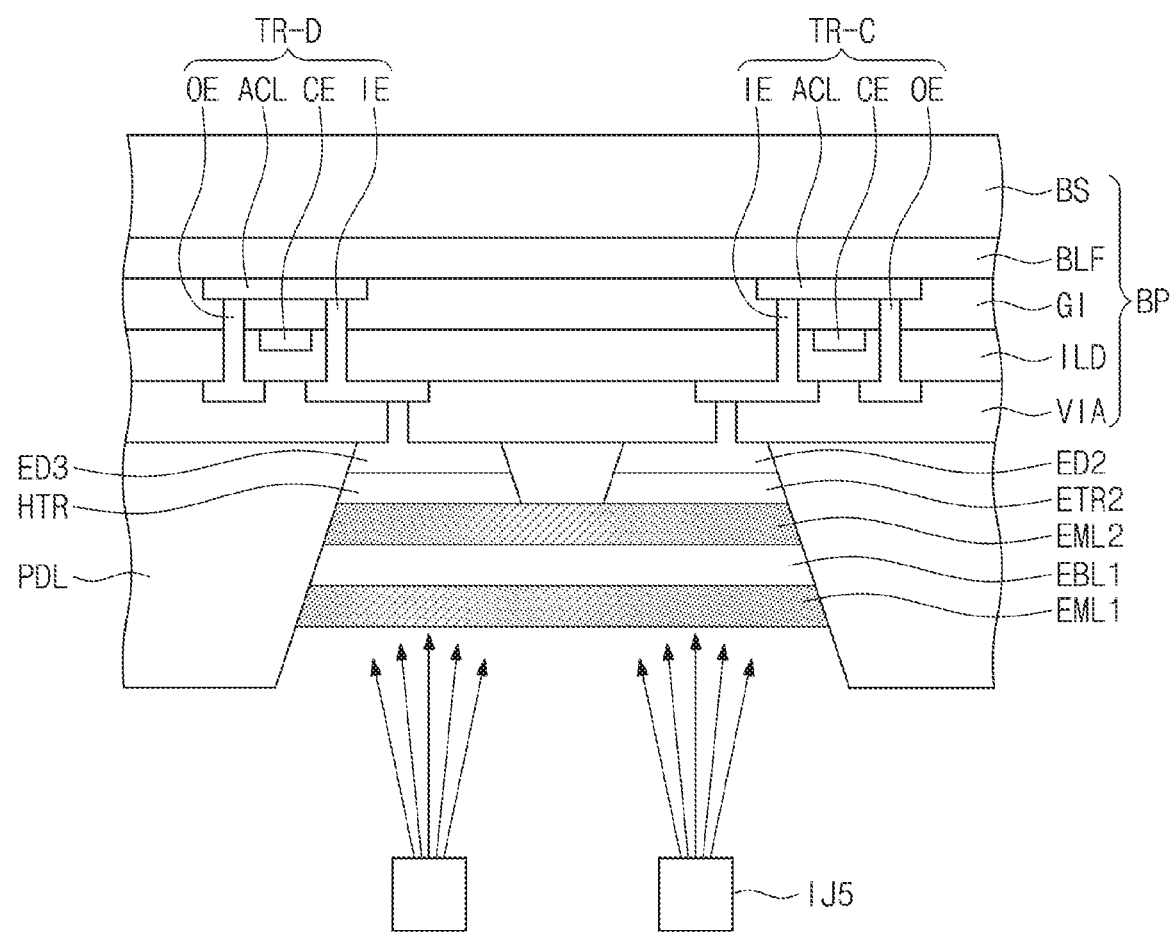

Referring to FIG. 10E, a fifth injector IJ5 may discharge a material for forming the first light emitting layer EML1. The material discharged from the fifth injector IJ5 may be disposed on the first electron blocking layer EBL1.

Figure 10F:
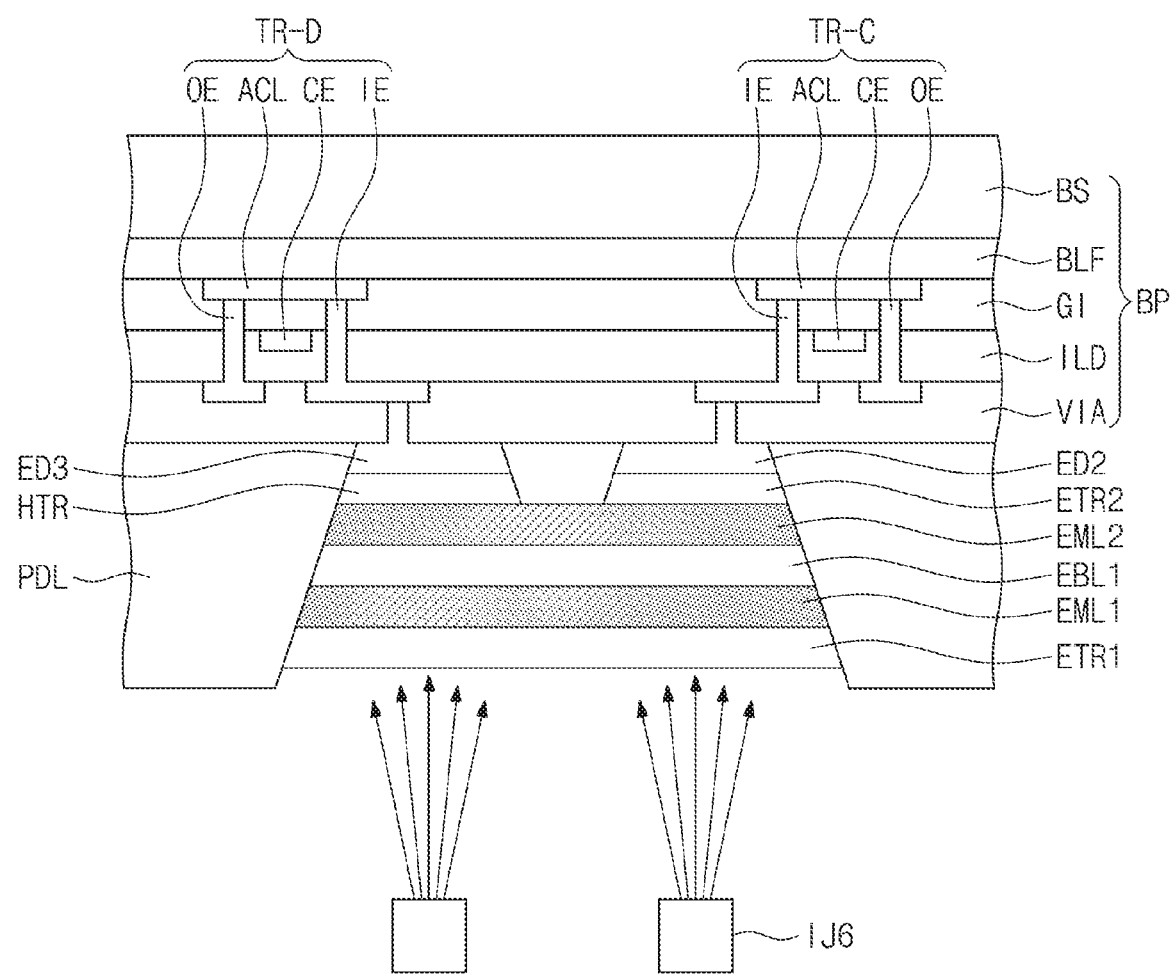

Referring to FIG. 10F, a sixth injector IJ6 may discharge a material for forming the first electron transport region ETR1. The material discharged from the sixth injector IJ6 may be disposed on the first light emitting layer EML1.

Although the organic light emitting device OLED-1 of FIG. 8 is mainly described in FIGS. 10A to 10F, a process of manufacturing other organic light emitting devices OLED and OLED-2 may also be similar to that of manufacturing the organic light emitting device of FIGS. 10A to 10F.

According to the embodiment of the inventive concept, since the two light emitting layers provided in the one organic light emitting device are individually driven, a time taken to drive one light emitting layer may be reduced by half. Therefore, the lifespan of the organic light emitting device may be improved.

Also, the two light emitting layers may be disposed to be laminated with each other in the one organic light emitting device, thereby providing the display apparatus having the higher resolution.

It will be apparent to those skilled in the art that various modifications and variations can be made in the inventive concept. Thus, it is intended that the present disclosure covers the modifications and variations of this invention provided they come within the scope of the appended claims and their equivalents. Thus, to the maximum extent allowed by law, the scope of the present invention is to be determined by the broadest permissible interpretation of the following claims and their equivalents, and shall not be restricted or limited by the foregoing detailed description.

What is claimed is:

1. An organic light emitting device, comprising:
   a first electrode;
   a first electron transport region disposed below the first electrode;
   a first light emitting layer disposed below the first electron transport region;
   a first electron blocking layer disposed below the first light emitting layer;
   a second light emitting layer comprising a first area, a second area adjacent to the first area, and a third area adjacent to the second area and disposed below the first electron blocking layer;
   a second electron transport region disposed below the second light emitting layer to overlap the first area;
   a second electrode disposed below the second electron transport region;
   a hole transport region disposed below the second light emitting layer to overlap the third area;
   a third electrode disposed below the hole transport region; and
   an insulation member disposed below the second light emitting layer to overlap the second area.

2. The organic light emitting device of claim 1, wherein the insulation member insulates the second electron transport region and the second electrode from the hole transport region and the third electrode.

3. The organic light emitting device of claim 1, further comprising a second electron blocking layer disposed between the second light emitting layer and the hole transport region to overlap the third area.

4. The organic light emitting device of claim 1, further comprising a charge generating layer disposed between the hole transport region and the third electrode.

5. The organic light emitting device of claim 1, wherein the second electrode and the second electron transport region overlap only the first area of the first area, the second area, and the third area.

6. The organic light emitting device of claim 5, wherein the insulation member overlaps only the second area of the first area, the second area, and the third area.

7. The organic light emitting device of claim 6, wherein the third electrode and the hole transport region overlap only the third area of the first area, the second area, and the third area.

8. The organic light emitting device of claim 1, wherein the first light emitting layer and the second light emitting layer comprise the same material.

9. The organic light emitting device of claim 1, wherein the first light emitting layer comprises a first material, and the second light emitting layer comprises a second material different from the first material.

10. A display apparatus comprising:
    a display panel comprising an organic light emitting device,
    wherein the organic light emitting device comprises:
    a first electrode;
    a first electron transport region disposed below the first electrode;
    a first light emitting layer disposed below the first electron transport region;
    a first electron blocking layer disposed below the first light emitting layer;

a second light emitting layer comprising a first area, a second area adjacent to the first area, and a third area adjacent to the second area and disposed below the first electron blocking layer;

a second electron transport region disposed below the second light emitting layer to overlap the first area;

a second electrode disposed below the second electron transport region;

a hole transport region disposed below the second light emitting layer to overlap the third area;

a third electrode disposed below the hole transport region; and an insulation member disposed below the second light emitting layer to overlap the second area.

11. The display apparatus of claim 10, wherein electrons are provided in the first electrode and the second electrode, and holes are provided in the third electrode.

12. The display apparatus of claim 11, wherein the first light emitting layer emits light by at least a portion of the holes provided in the third electrode and at least a portion of the electrons provided in the first electrode.

13. The display apparatus of claim 11, wherein the first light emitting layer emits light by at least a portion of the holes provided in the third electrode and at least a portion of the electrons provided in the second electrode.

14. The display apparatus of claim 10, wherein the first light emitting layer and the second light emitting layer emit light at the same time.

15. The display apparatus of claim 10, wherein the first light emitting layer and the second light emitting layer emit light at timings different from each other.

16. The display apparatus of claim 10, wherein the light emitted from the first light emitting layer has the same color as that of the light emitted from the second light emitting layer.

17. The display apparatus of claim 10, wherein the light emitted from the first light emitting layer has a color different from that of the light emitted from the second light emitting layer.

18. The display apparatus of claim 10, wherein the organic light emitting device further comprises a second electron blocking layer disposed between the second light emitting layer and the hole transport region.

19. The display apparatus of claim 10, wherein the organic light emitting device further comprises a charge generating layer disposed between the hole transport region and the third electrode.

20. The display apparatus of claim 10, wherein the second electrode and the second electron transport region do not overlap the second area and the third area, the insulation member does not overlap the first area and the third area, and the third electrode and the hole transport region do not overlap the first area and the second area.

* * * * *